US006895563B2

(12) United States Patent
Dixon et al.

(10) Patent No.: US 6,895,563 B2
(45) Date of Patent: May 17, 2005

(54) UNIVERSAL LABORATORY PROTOTYPING INTERFACE SYSTEM

(76) Inventors: Paul K. Dixon, 259 Candy La., Redlands, CA (US) 92373; Tim Usher, 513 W. Hill Dr., San Bernordino, CA (US) 92407

( * ) Notice: Subject to any disclaimer, the term of this patent is extended or adjusted under 35 U.S.C. 154(b) by 582 days.

(21) Appl. No.: 09/930,000

(22) Filed: Aug. 14, 2001

(65) Prior Publication Data

US 2002/0124120 A1 Sep. 5, 2002

Related U.S. Application Data

(60) Provisional application No. 60/225,288, filed on Aug. 15, 2000.

(51) Int. Cl.[7] .......................... G06F 17/50; G06F 19/00
(52) U.S. Cl. ............................. 716/4; 702/108; 324/555
(58) Field of Search ..................... 716/1, 4; 702/57–80, 702/108, 117–122; 703/3, 13–28; 324/500, 512, 519–522, 525, 537, 555, 765; 700/121

(56) References Cited

U.S. PATENT DOCUMENTS

| 4,807,161 | A | * | 2/1989 | Comfort et al. | ............ 702/121 |
| 4,812,996 | A | * | 3/1989 | Stubbs | ........................ 702/123 |
| 4,868,785 | A | * | 9/1989 | Jordan et al. | ................ 345/440 |
| 4,901,221 | A | * | 2/1990 | Kodosky et al. | ............. 345/771 |
| 5,371,851 | A | * | 12/1994 | Pieper et al. | ................ 345/501 |
| 5,724,272 | A | * | 3/1998 | Mitchell et al. | ............. 702/123 |
| 5,734,863 | A | * | 3/1998 | Kodosky et al. | ............... 703/27 |
| 5,764,546 | A | * | 6/1998 | Bryant et al. | ................ 702/108 |
| 6,049,764 | A | * | 4/2000 | Stahl | ........................... 702/183 |
| 6,085,156 | A | * | 7/2000 | Rust et al. | ..................... 702/91 |
| 6,263,255 | B1 | * | 7/2001 | Tan et al. | .................... 700/121 |
| 6,608,638 | B1 | * | 8/2003 | Kodosky et al. | ............. 345/771 |
| 6,690,981 | B1 | * | 2/2004 | Kawachi et al. | .............. 700/83 |

* cited by examiner

Primary Examiner—Leigh M. Garbowski
(74) Attorney, Agent, or Firm—Christie, Parker & Hale, LLP

(57) ABSTRACT

The invention includes a main circuit board which is coupled by a 68 pin SCSI-2 connector to a National Instruments DAQ (PCI-6024E or equivalent) which resides in an expansion slot of a personal computer running National Instruments LABVIEW software which has been modified to include a custom communications driver. The main circuit board includes a communications module, a manual control module, a function generator, an analog I/O module, a current amplifier and frequency calibration module, and an address and status module. The main circuit board is also provided with a first edge connector for receiving a removable protection board which has a second edge connector for receiving a removable prototyping breadboard. The protection board protects the main circuit board and the DAQ from circuit faults on the prototyping breadboard. The main circuit board communicates with the DAQ via 8 digital I/O lines.

16 Claims, 11 Drawing Sheets

UNIVERSAL LABORATORY PROTOTYPING INTERFACE SYSTEM

This application claims the benefit of Ser. No. 60/225,228 filed Aug. 15, 2000, the complete disclosure of which is hereby incorporated by reference herein.

BACKGROUND OF THE INVENTION

1. Field of the Invention

The invention relates to electronic development systems. More particularly, the invention relates to a prototyping interfacing system for use with a personal computer to test and evaluate electronic circuits.

2. Brief Description of the Prior Art

It is now common to utilize personal computers in the design and testing of electronic circuits. For example, multipurpose input-output data acquisition cards (MIO) are available from companies like National Instruments Corporation, Austin, Tex. These cards plug into an expansion slot of a personal computer and come bundled with software which enables the computer to function as virtual test equipment. For example, the LabVIEW software from National Instruments Corporation emulates a voltmeter and an oscilloscope and can be programmed to perform some signal processing.

At present, there is no standard way to connect a DAQ to a prototype circuit for testing and evaluation. Moreover, the presently available MIO not provide or emulate waveform function generators of fully featured digital multimeters.

SUMMARY OF THE INVENTION

It is therefore an object of the invention to provide a fully featured electronics prototyping system.

It is also an object of the invention to provide a fully featured electronics prototyping system which operates in conjunction with a personal computer.

It is another object of the invention to provide a fully featured electronics prototyping system which has a standard interface for connecting with circuits to be tested and evaluated.

It is yet another object of the invention to provide a fully featured electronics prototyping system which includes a waveform function generator and a fully featured digital multimeter.

In accord with these objects which will be discussed in detail below, the invention includes a main circuit board which is coupled by a 68 pin SCSI-2 connector to a National Instruments DAQ card (PCI-6024E or equivalent) which resides in a PCI slot of a personal computer running National Instruments LabVIEW software which has been enhanced to include a custom communications driver. The main circuit board includes a communications module, a manual control module, a function generator, an analog I/O module, a current amplifier and frequency calibration module, and an address and status module. The main circuit board is also provided with a first edge connector for receiving a removable protection board which has a second edge connector for receiving a removable prototyping breadboard. The protection board protects the main circuit board and the DAQ from circuit faults on the prototyping breadboard. The main circuit board communicates with the DAQ via 8 digital I/O lines.

The communications module supports 8-bit write, 7-bit addressing, 1-bit parity checking, and 8-bit read. The communications module is used primarily to set the function generator and the digital multimeter and thus a data transfer rate of approximately 2400 bps is sufficient.

The function generator module utilizes inexpensive digital to analog converters and analog switching gates to control a low cost analog function generator chip. The controls are latched, so the function generator can hold its state indefinitely. It can be controlled from the personal computer or from the manual control module as well. The function generator can generate sine, triangle and square waves from approximately 0.1 Hz to 250 kHz. The waveform choice, coarse frequency, fine frequency, amplitude, and direct current (DC) voltage offset are all programmable. In addition, it has amplitude modulation (AM) and frequency modulation (FM) inputs from the prototyping breadboard and internally via the DAQ analog outputs. The waveform output and synchronous digital output both feed back into the DAQ via analog gates. This allows for automatic calibration and dynamic auto-tuning of frequency, amplitude and DC offset.

Using analog gates and simple linear circuits, the analog I/O module routes the analog inputs and analog outputs of the DAQ to emulate a full-featured digital multimeter. In addition, it functions as both a 2-terminal and 3-terminal I-V curve tracer capable of characterizing diodes, transistors, etc.

The function generator and analog I/O modules use a fraction of the 128 addresses available to the DAQ. According to the presently preferred embodiment, 16 output addresses and 16 input addresses are dedicated for use by the prototyping board. Using an addressing bus made available on the prototyping board, the 8-bit data written to the prototyping board can be directed to 16 separate addresses. In addition, the prototyping board read bus can accept data from 16 separate output buffers. This allows for the development of sophisticated circuits. In addition, 32 more addresses have been reserved for future use by the prototyping board.

The invention provides a complete turnkey electronics design and testing solution in a desktop module about the size of a small VCR. It has tremendous flexibility for modification and expansion. The present invention has been designed to be a complete, affordable, computer-interfaced electronics design station including a full suite of software-based test and measure instruments. It has been designed for all experience levels, including educational interests, particularly for use at the college/university level, high school/technical college level, industrial/commercial setting, as well as personal/hobbyist use.

The invention goes beyond the traditional breadboard "trainer" with the power and flexibility of computer-based instrumentation.

Because the invention has both commercial and educational applications, the terms "prototyping board", "prototyping breadboard", and "student board" are used herein interchangeably.

BRIEF DESCRIPTION OF THE APPENDIX

The custom communication driver of the invention is included herewith on an ISO 9660 format CDROM. As mentioned above, the communications driver is intended to be used with National Instruments LabVIEW software which is available in versions for WINDOWS, UNIX, SUN SPARC and MACINTOSH operating systems. The filename of the driver is "ulis comm core.llb". It is a LabVIEW library file containing the main program "ulis comm core driver.vi" and 18 custom subprograms (subvis). It was written in LabVIEW 6.0 on a Windows 98 machine and can be opened with LabVIEW 6.0 or higher on any LabVIEW-compatible platform. The documentation is built into the front panels and diagrams of the various program components.

DETAILED DESCRIPTION

Figure 1:
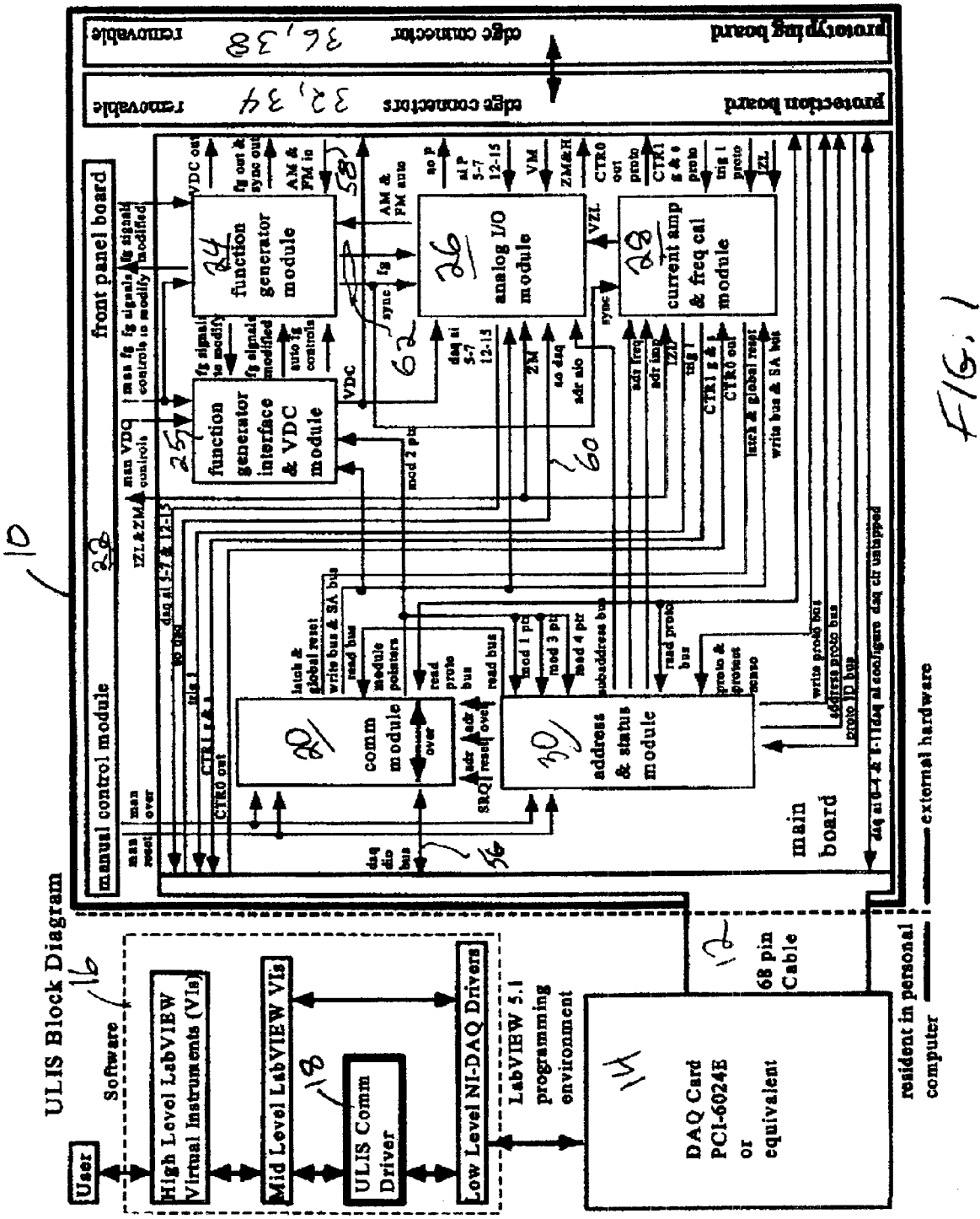
FIG. 1 is a high level block diagram of the main circuit board, DAQ card, and personal computer.

Turning now to FIG. 1, the invention includes a main circuit board 10 which is coupled by a 68 pin SCSI-2 connector 12 to a National Instruments DAQ (PCI-6024E or equivalent) 14 which resides in a PCI slot of a personal computer running National Instruments LabVIEW software 16 which has been modified to include a communications driver 18.

The main circuit board 10 includes a communications module 20, a manual control module 22, a function generator 24 and associated interface 25, an analog I/O module 26, a current amplifier and frequency calibration module 28, and an address and status module 30. These components are coupled to each other as shown in FIG. 1.

Figure 2:
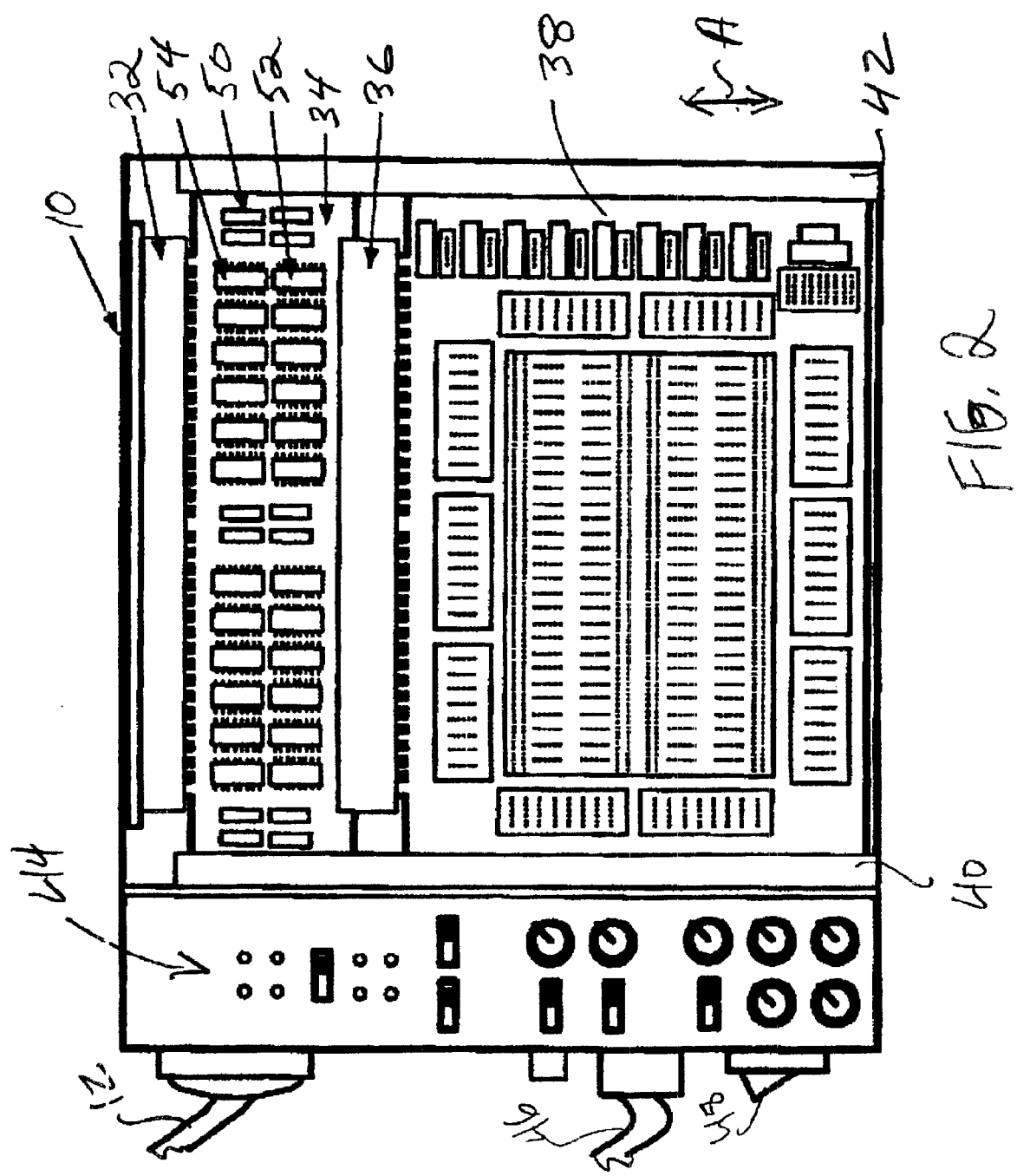
FIG. 2 is a plan view illustrating the presently preferred layout of the components of the invention.

Referring now to FIG. 2, the main circuit board 10 is also provided with a first edge connector 32 for receiving a removable protection board 34 which has a second edge connector 36 for receiving a removable prototyping breadboard 38. The edge connectors 32, 36 are preferably EISA 98 pin edge connectors. A pair of card slides 40, 42 are located on either side of edge connector 32. The cards 34 and 38 are installed/removed by sliding them in the direction of the arrow A. Thus, the prototyping board 38 may be installed with or without the protection board 34.

Figure 4:
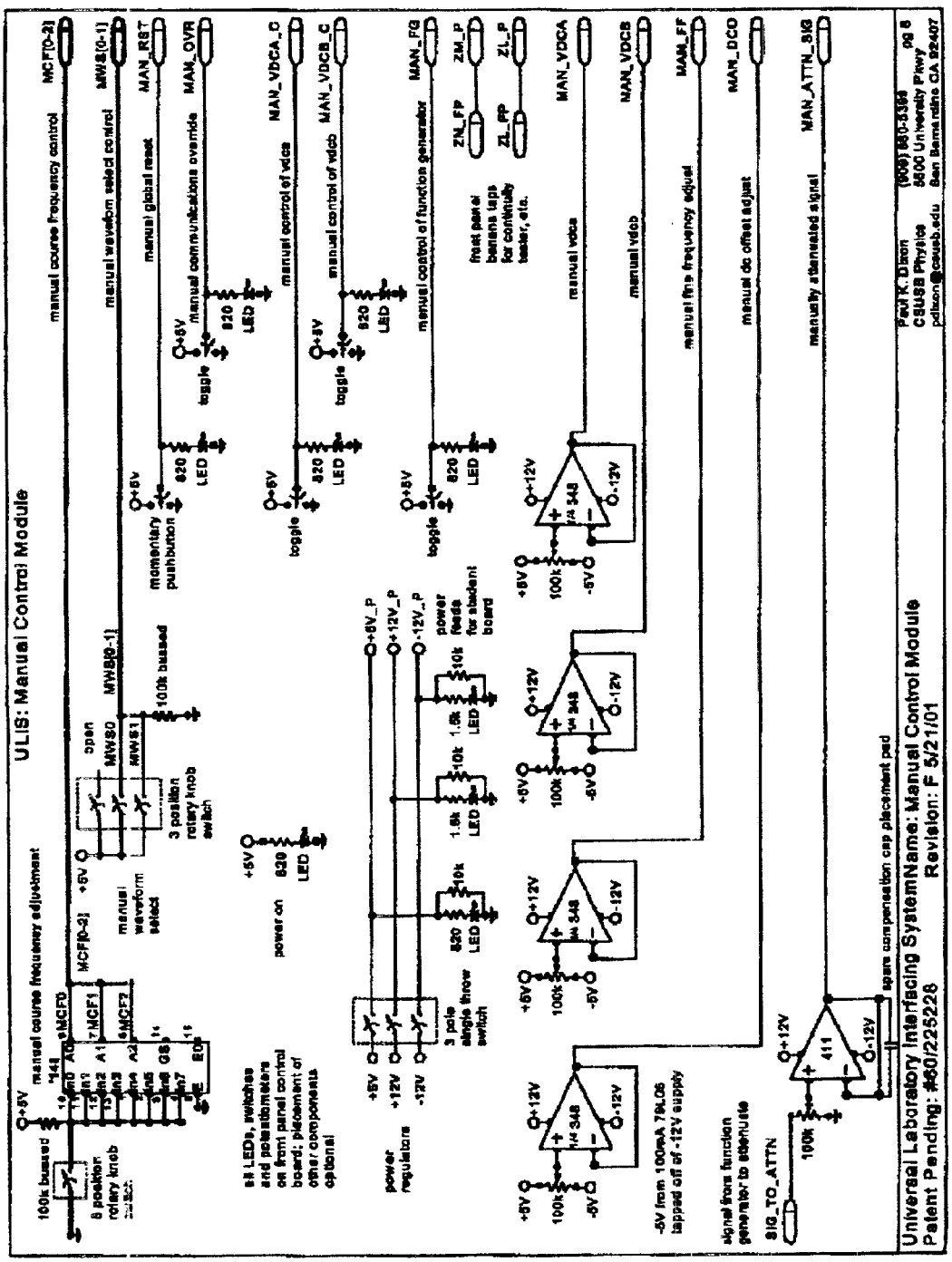
FIG. 4 is a schematic diagram illustrating details of the manual control module.

As illustrated schematically in FIG. 2, the presently preferred embodiment includes a front panel 44 which is controlled by the manual control module (22 in FIG. 1), a power cord 46, and a power switch 48. The front panel 44 has a plurality of dials and switches which can be used to operate the circuits on the main circuit board and/or which can be used by the prototyping board. Details of the manual control module are illustrated in FIG. 4.

Figure 9:
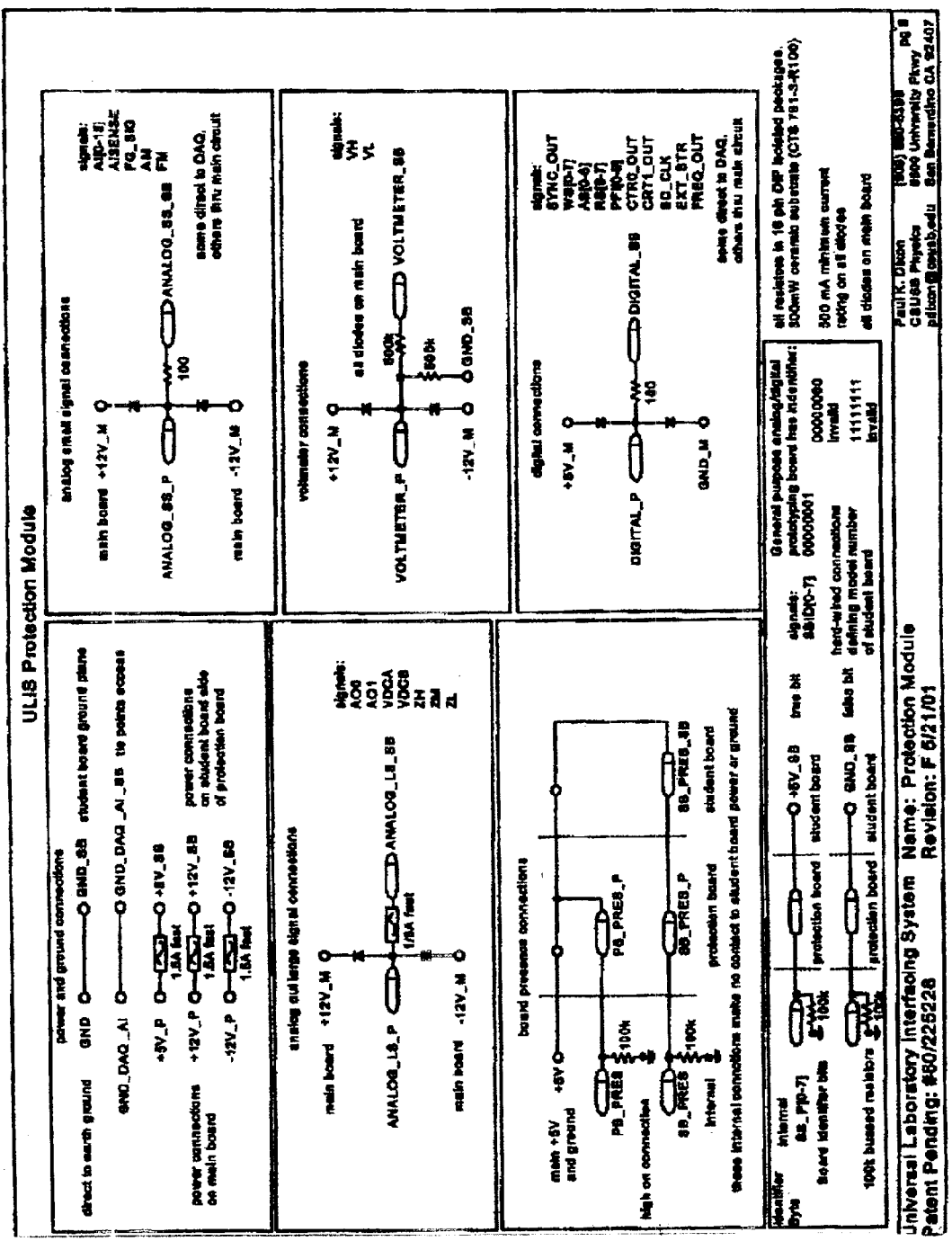
FIG. 9 is a schematic diagram illustrating details of the circuits used in the protection board.
Figure 10:
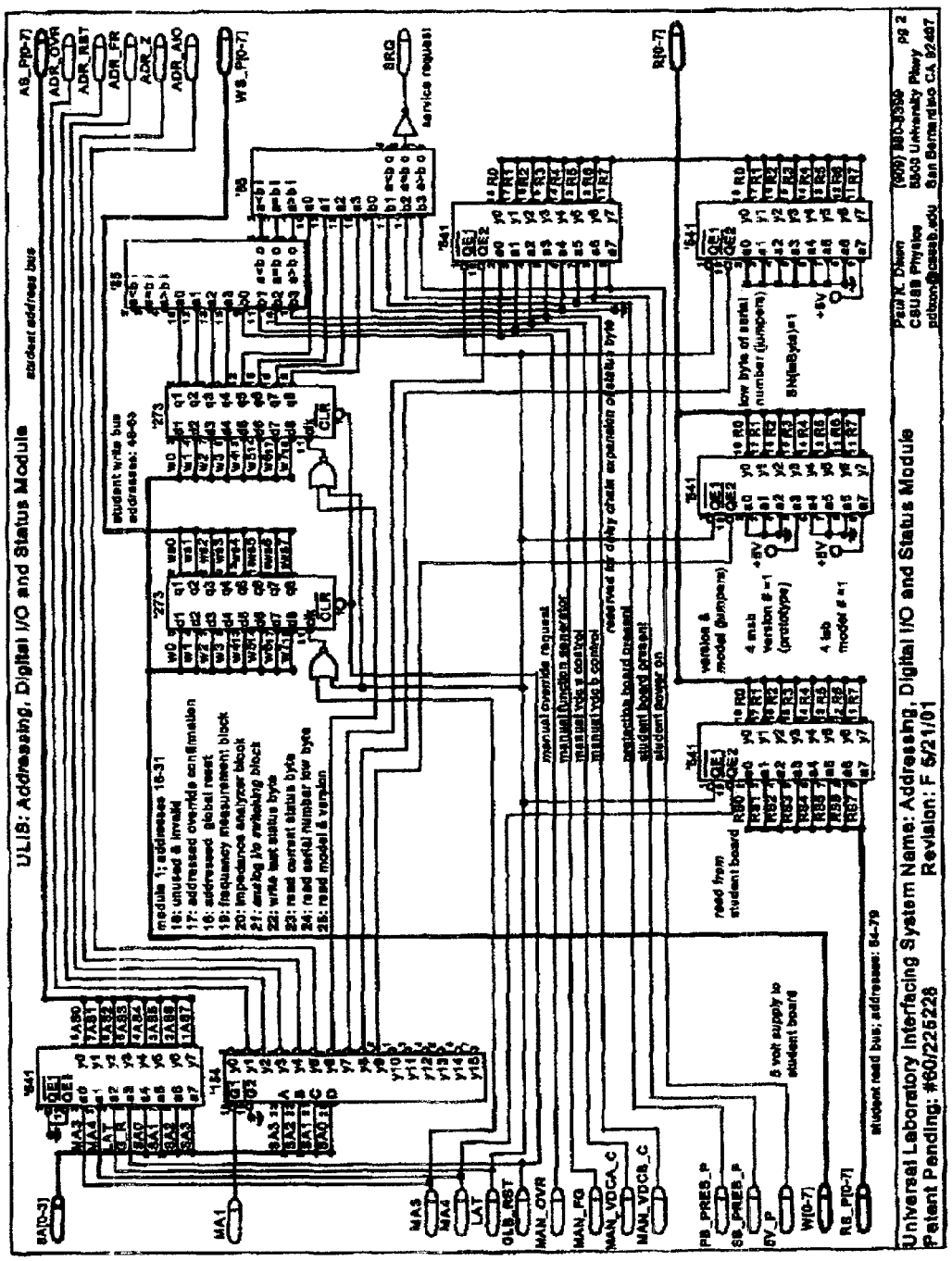
FIGS. 10 and 11 are a schematic diagram illustrating details of the address and status module.
Figure 11:
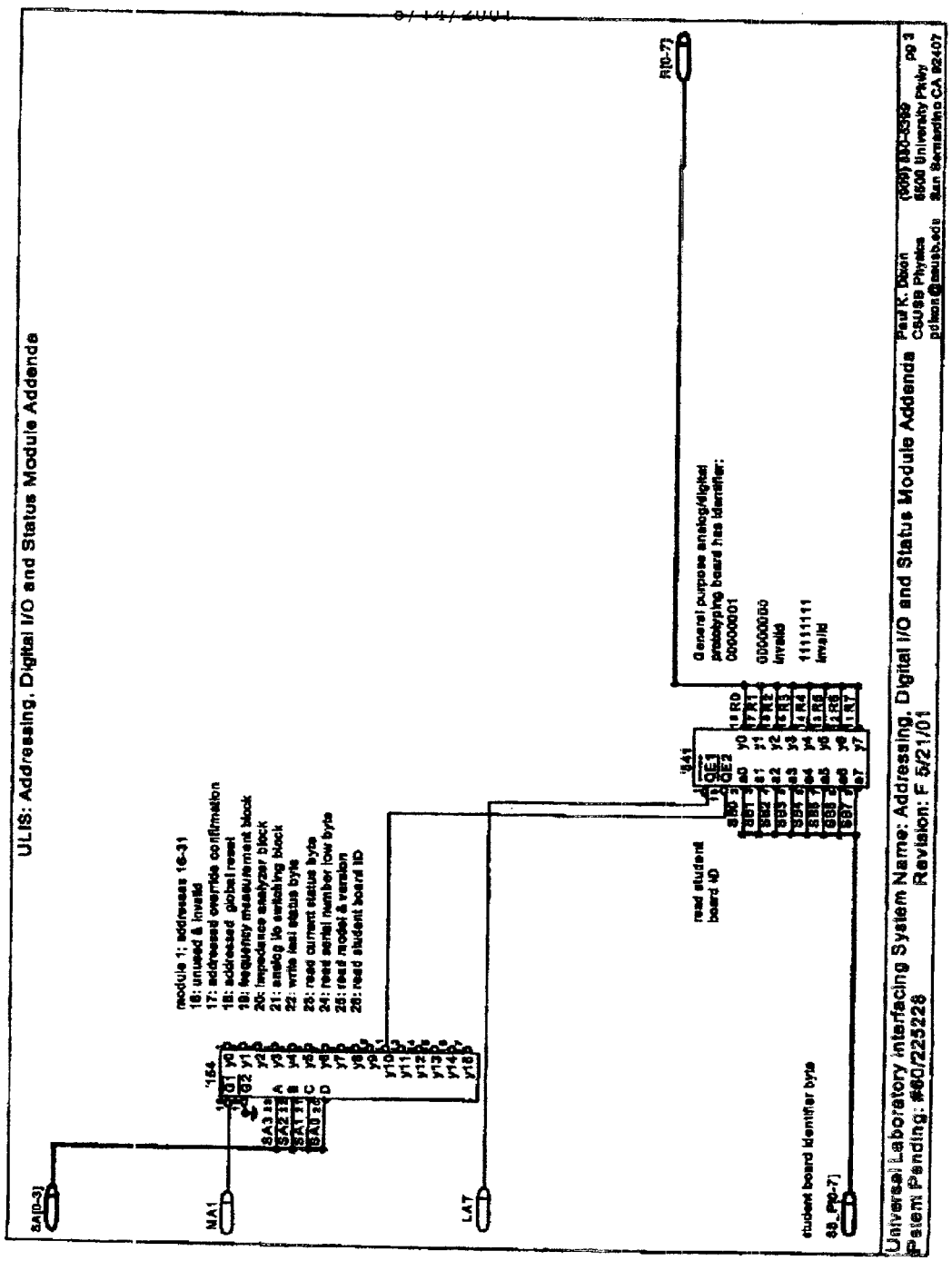

The protection board 34 protects the main circuit board and the DAQ from circuit faults on the prototyping breadboard. It includes a number of fuses 50, resistor network chips 52 and diode network chips 54. Details of the protection board 34 are illustrated in FIG. 9.

Figure 3:
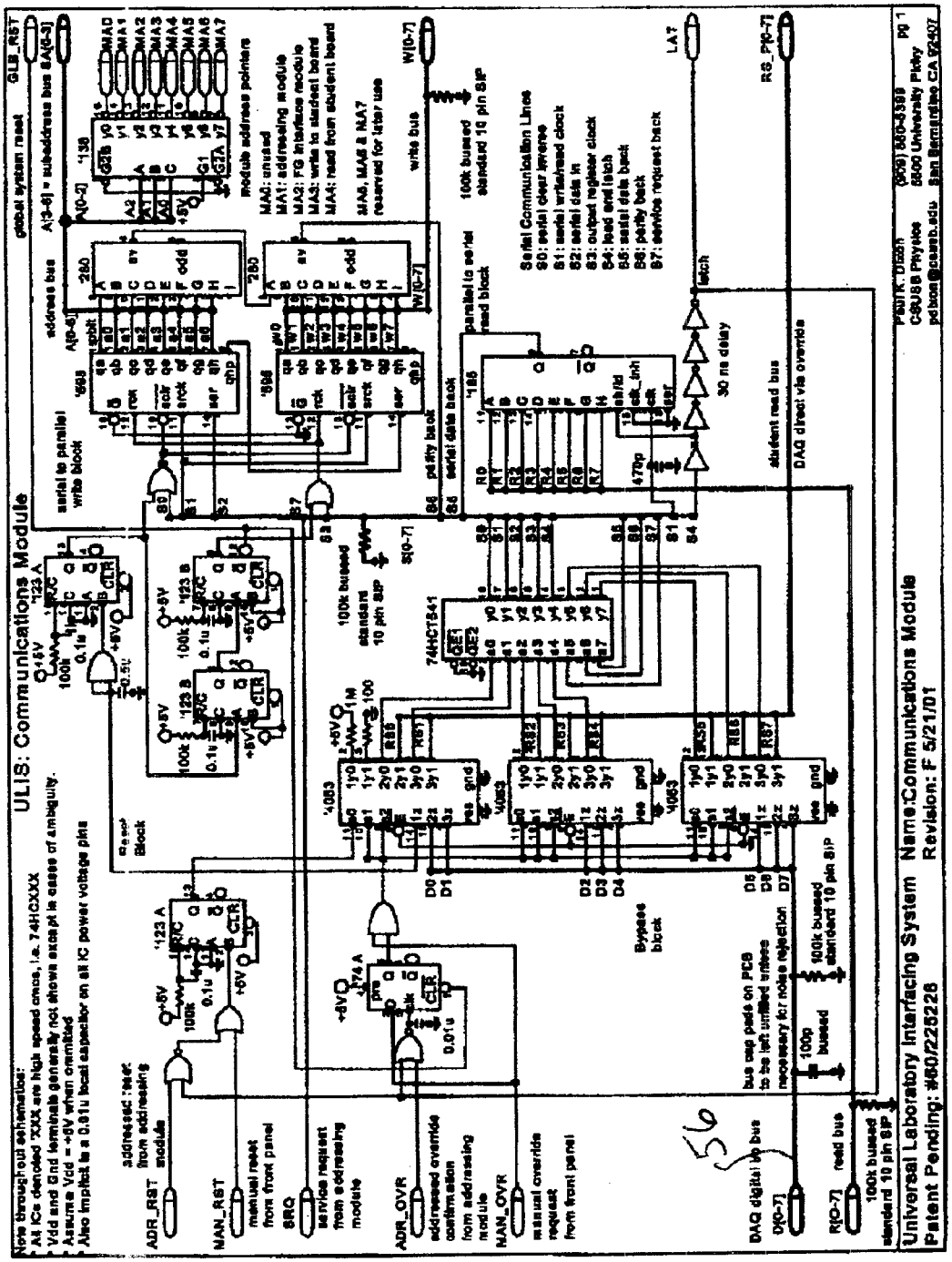
FIG. 3 is a schematic diagram illustrating details of the communications module.

Referring once again to FIG. 1, the main circuit board 10 communicates via the communications module 20 with the DAQ 14 via 8 digital I/O lines 56. The communications module 20 supports 8-bit write, 7-bit addressing, 1-bit parity checking, and 8-bit read. The communications module 20 is used primarily to set the function generator 24 (via the function generator interface 25) and the analog I/O module 26 (via the current amplifier and frequency calibration module 28). Thus, a data transfer rate of approximately 2400 bps is sufficient. Details of the communications module are illustrated in FIG. 3.

Figure 5:
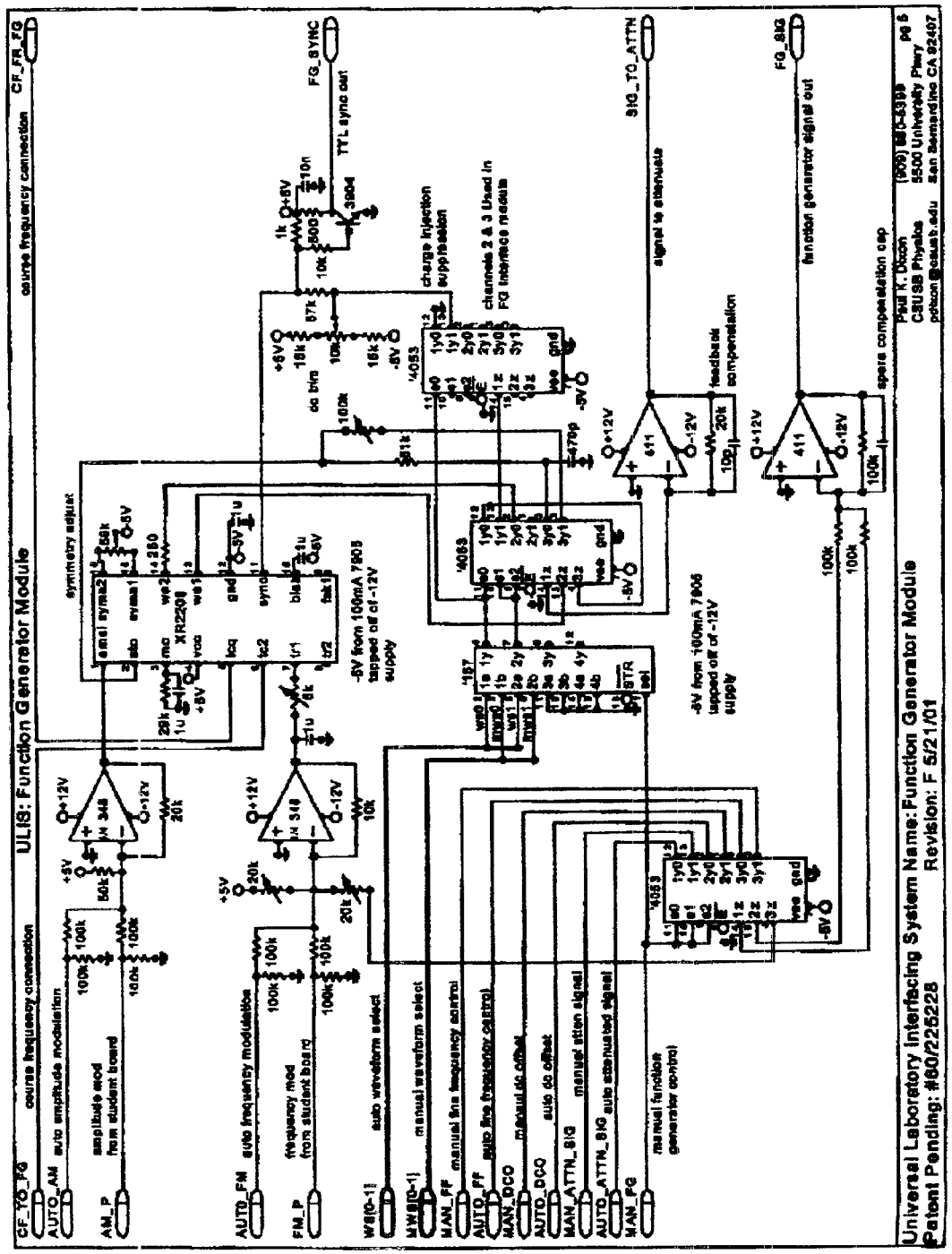
FIG. 5 is a schematic diagram illustrating details of the function generator module.
Figure 6:
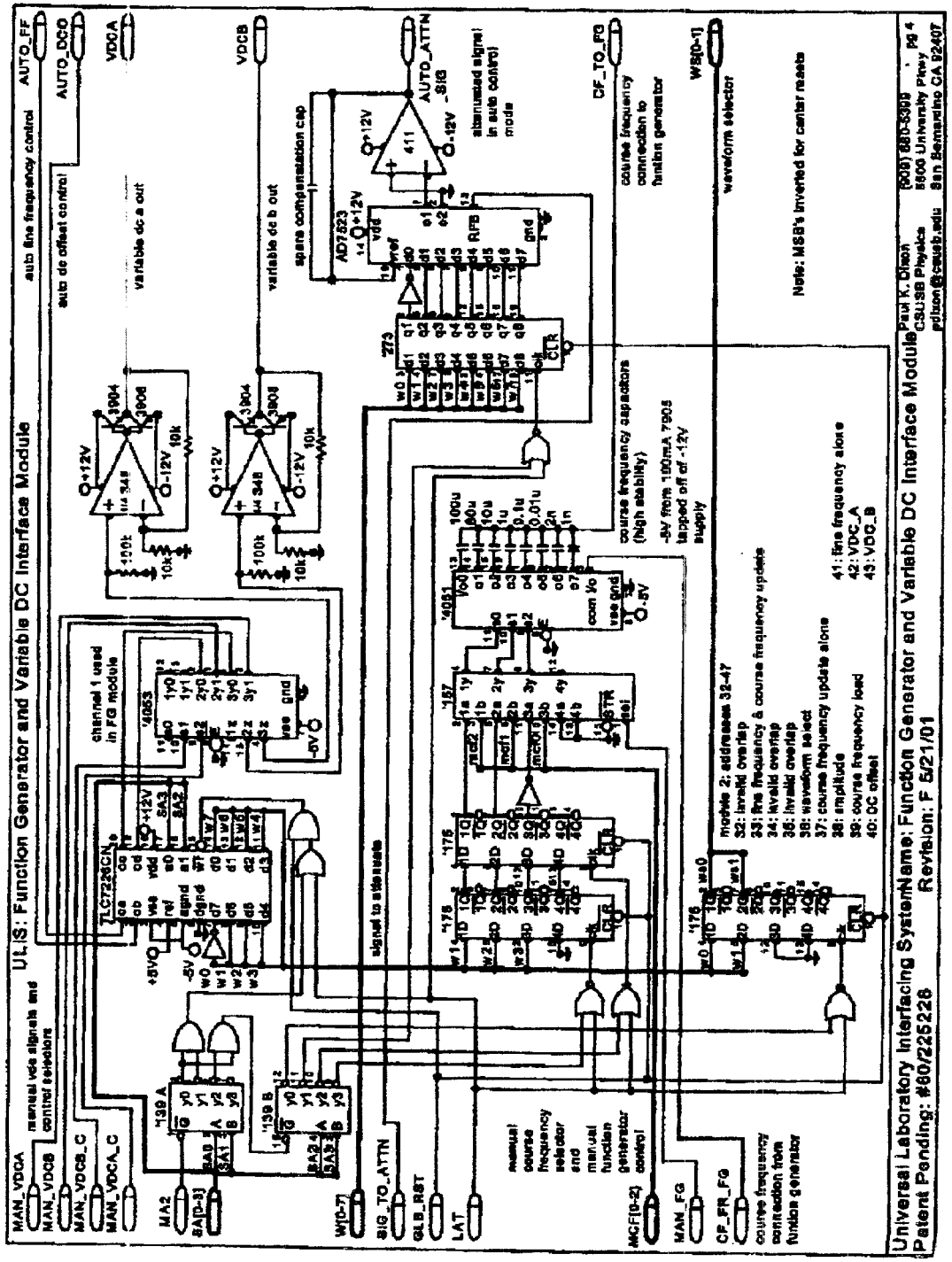
FIG. 6 is a schematic diagram illustrating details of the function generator and variable DC interface module.

The function generator module 24 (and interface 25) utilizes inexpensive digital to analog converters and analog switching gates to control a low cost analog function generator chip. The controls are latched, so the function generator can hold its state indefinitely. It can be controlled from the personal computer or from the front panel (44 in FIG. 2) as well. The function generator can generate sine, triangle and square waves from 0.1 Hz to 250 kHz. The waveform choice, course frequency, fine frequency, amplitude, and direct current (DC) voltage offset are all programmable via the interface 25. In addition, the frequency generator module 24 has amplitude modulation (AM) and frequency modulation (FM) inputs 58 from the prototyping breadboard and internally via the DAQ analog outputs 60. The waveform output and synchronous digital output 62 both feed back into the DAQ via analog gates in the analog I/O module 26. This allows for automatic calibration and dynamic auto-tuning of frequency, amplitude and DC offset. Details of the function generator module and associated interface are illustrated in FIGS. 5 and 6.

Figure 7:
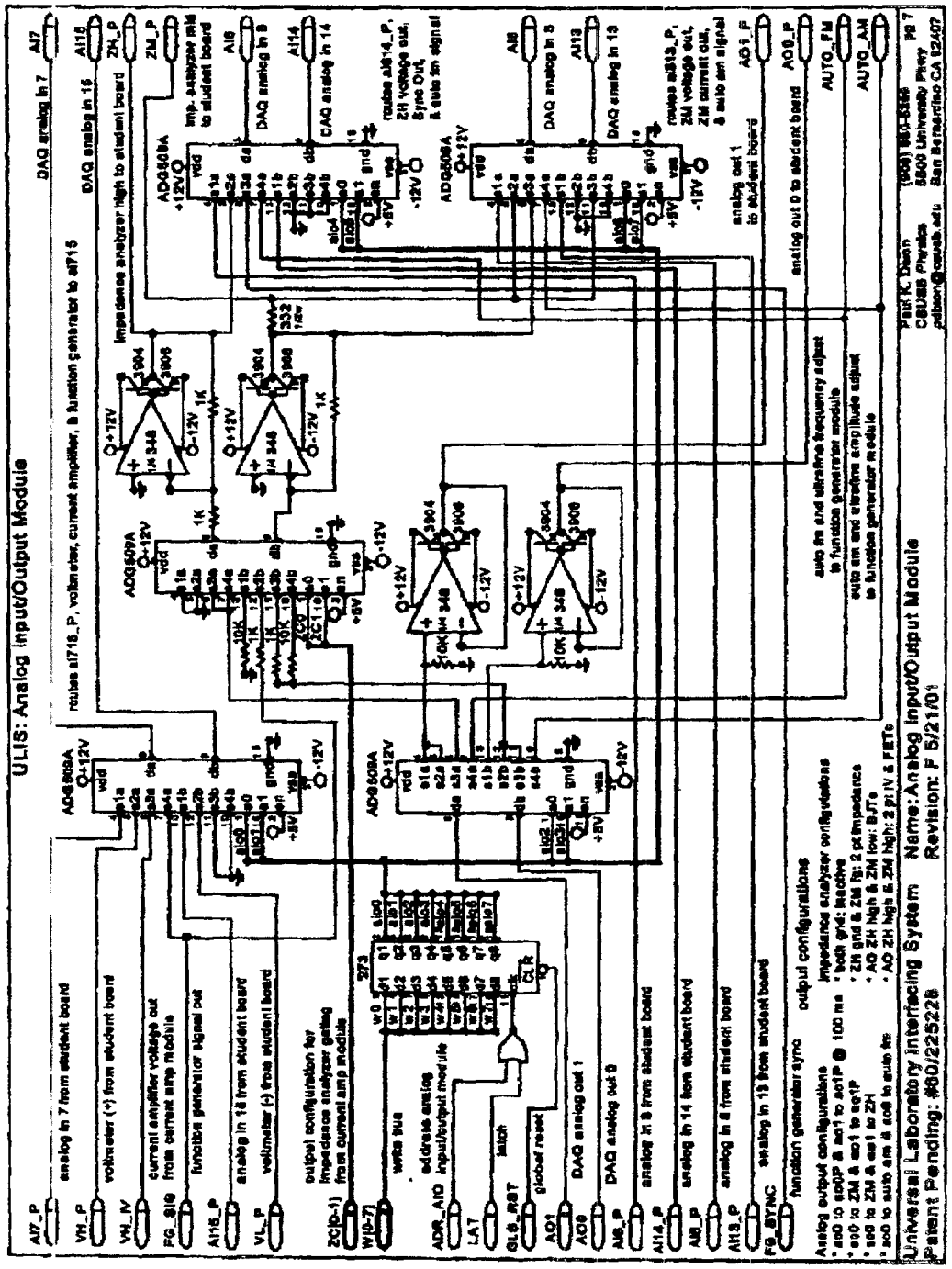
FIG. 7 is a schematic diagram illustrating details of the analog I/O module.
Figure 8:
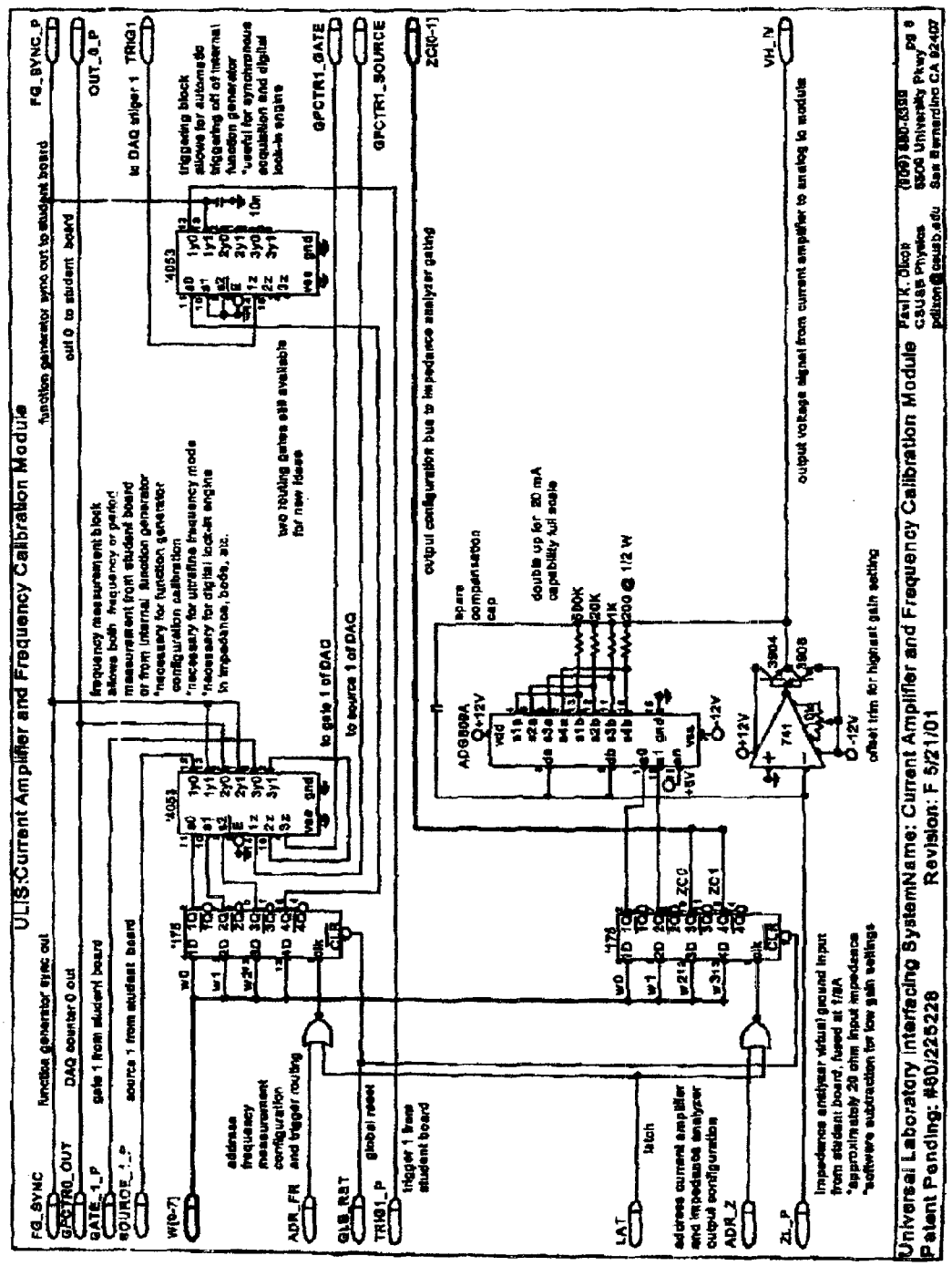
FIG. 8 is a schematic diagram illustrating details of the current amplifier and frequency calibration module.

The analog I/O module 26 uses analog gates and simple linear circuits to route the analog inputs and analog outputs of the DAQ 14 to emulate a full-featured digital multimeter. In addition, it functions as both a 2-terminal and 3-terminal I–V curve tracer capable of characterizing diodes, transistors, etc. Details of the analog I/O module are illustrated in FIG. 7.

The function generator and analog I/O modules 24, 26 use a fraction of the 128 addresses available to the DAQ. According to the presently preferred embodiment, 16 output addresses and 16 input addresses are dedicated for use by the prototyping board. Using an addressing bus made available on the prototyping board, the 8-bit data written to the prototyping board can be directed to 16 separate addresses. In addition, the prototyping board read bus can accept data from 16 separate output buffers. This allows for the development of sophisticated circuits. In addition, 32 more addresses have been reserved for future use by the prototyping module.

As mentioned above, FIGS. 3–11 illustrate the components of the invention is detail. Those skilled in the art will have a better appreciation of these Figures through reference to the following parts list.

| Category | Subgroup | Item | Description |
|---|---|---|---|
| Internal Electronics Board | | | |
| | Digital Logic | | |
| | | 74HC02 | quad NOR |
| | | 74HC04 | hex Inverter |
| | | 74HC08 | quad AND |
| | | 74HC32 | quad OR |
| | | 74HC74 | dual D latch |
| | | 74HC85 | 4 bit comparator |
| | | 74HC123 | dual one shot |

-continued

| Category | Subgroup | Item | Description |
|---|---|---|---|
| | | 74HC138 | 3 to 8 decoder |
| | | 74HC139 | dual 2 to 4 decoder |
| | | 74HC148 | 8 to 3 encoder |
| | | 74HC154 | 4 to 16 decoder |
| | | 74HC157 | quad 2 in mux |
| | | 74HC165 | parallel to serial 8 bit |
| | | 74HC175 | quad D latch |
| | | 74HC273 | octal D latch |
| | | 74HC280 | parity generator |
| | | 74HC541 | octal tri-state buffer |
| | | 74HC595 | serial to parallel 8 bit |
| | | 74HCT541 | octal tri-state buffer |
| Digital Bidirectional Gating | | | |
| | | 74HC4053 | triple 2-ch analog mux |
| Analog Gating | | | |
| | | 74HC4051 | 8-ch analog mux |
| | | 74HC4053 | triple 2-ch analog mux |
| | | DG509 (Harris) | dual 4 to 1 analog mux |
| Digital to Analog Converters | | | |
| | | TLC7226 (Tex. Inst.) | quad 8-bit DAC |
| | | AD7523 (Analog Dev.) | four quadrant 8-bit mult DAC |
| Function Generators | | | |
| | | XR2206 (Exar) | sin, sq, tri, function generator |
| Operational Amplifiers | | | |
| | | LM741 | 741 op amp |
| | | LM348 | quad 741 op amp |
| | | LF411 | JFET op amp |
| Transistors | | | |
| | | 2N3904 | npn 100 mA |
| | | 2N3906 | pnp 100 mA |
| High Stability Timing Capacitors | | | |
| | | 100 u | tantalum |
| | | 80 u | tantalum |
| | | 10 u | tantalum |
| | | 1 u | tantalum |
| | | 0.1 u | polystyrene |
| | | 10 n | polystyrene |
| | | 2.2 n | polystyrene |
| | | 1 n | polystyrene |
| Trim Pots | | | |
| | | 5k | 15 turn potentiometer |
| | | 10k | 15 turn potentiometer |
| | | 20k | 15 turn potentiometer |
| | | 50k | 15 turn potentiometer |
| | | 100k | 15 turn potentiometer |
| Single-in-Line Bussed Resistors | | | |
| | | 100k | 10 pin |
| Connectors | | | |
| | | 98 pin EISA card edge | standard extended ISA |

-continued

| Category | Subgroup | Item | Description |
|---|---|---|---|
| | | 68 pin D-type (uwscsi) | connect to E-series DAQ |
| | | 26 pin ribbon | connect to front panel |
| | Individual Resistors | | |
| | | ¼ w metal film | 5% (appx numbers) |
| | | ½ w metal film | 5% (appx numbers) |
| | | ¼ w carbon | 10% (appx numbers) |
| | Capacitors | | |
| | | misc value ceramic | (appx numbers) |
| | | 10 u | electrolytic (appx numbers) |
| FrontPanel Board | | | 2" × 9" inch, double sided, .02" linewidth |
| | Switches | | |
| | | 8 position rotary | 8 position rotary w/kbob |
| | | 3 position rotary | 3 position rotary w/knob |
| | | momentary pushbutton | momentary pushbutton |
| | | spst toggle | spst toggle |
| | | 4pst | student DC power switch |
| | Potentiometers | | |
| | | 100k | single turn w/ knob |
| | LEDs | | |
| | | standard | multiple colors |
| | Connectors | | |
| | | 26 pin ribbon | connect to internal board |
| | Individual Resistors | | |
| | | ¼ w carbon | 10% (appx numbers) |
| | Capacitors | | |
| | | misc value ceramic | ceramic (appx numbers) |
| | | 10 u | electrolytic (appx numbers) |
| Protection Board | | | Estimate: 10" × 3" double-sided, plated-thru, .007" linewidth |
| | Fuses | | |
| | | 10 A slow | 10 A slow |
| | | 1.5 A fast | 1.5 A fast |
| | | ⅛ A fast | ⅛ A fast |
| | Soldered PC Mount Fuse Holder Pairs | | |
| | | standard fuse holders | standard fuse holders (pair) |
| | Dual-in-Line Resistor | | |
| | | 100 ohm | isolated 16 pin DIP |
| | | 1k | isolated 16 pin DIP |
| | Dual-in-Line Diodes | | |
| | | 100 mA | Isolated 8 ch bussed DIP |
| | IC sockets | | |
| | | 16 pin | standard 16 pin DIP |
| | Connectors | | |
| | | 98 pin EISA card edge | standard extended ISA |
| Student Board | | | 12" × 10" inch, double sided, |

-continued

| Category | Subgroup | Item | Description |
|---|---|---|---|
| | | | .02" linewidth |
| | Breadboards | | |
| | | 640 tie point (3M) | work area |
| | | 100 tie point (3M) | voltage rails |
| | Soldered Tie Points | | |
| | | 1 × 5 PC mount (3M) | tie points to PC board traces |
| | | 2 × 5 PC mount (3M) | tie points to PC board traces |
| | | 3 × 5 PC mount (3M) | tie points to PC board traces |
| | | 1 × 2 LED PC mnt (3M) | tie points w/ LED slot |
| | LEDs | | |
| | | 5 V | LEDs w/internal resistor |
| | | 12 V | LEDs w/internal resistor |
| | Connectors | | |
| | | Banana (Deltron) | PC mount side entry |
| | | 9-pin D-type | PC mount male, standard serial |
| PowerSupply | | | |
| | Transformer | | |
| | | 5 tap, center tap | for +12 V, +5 V @ ~1.5 A |
| | Voltage Regulators w/Heat Sinks | | |
| | | 7905 | Pos 5 V @ 1.5 A |
| | | 7805 | Neg 5 V @ 100 mA |
| | | 7912 | Pos 12 V @ 1.5 A |
| | | 7812 | Neg 12 V @ 1.5 A |
| | Diodes | | |
| | | 1N4001 | power diodes |
| | Capacitors | | |
| | | 1000 u @ 50 V | input stabilizer caps |
| | | 100 u A 35 V | output stabilizer caps |
| | AC Line | | |
| | | power entry module | integrated fuse and 120/220 |
| | | standard power cord | country of destination |
| | Fan | | |
| | | AC is better | DC brushless are noisy |

There have been described and illustrated herein methods and apparatus for prototyping electronic circuits. While particular embodiments of the invention have been described, it is not intended that the invention be limited thereto, as it is intended that the invention be as broad in scope as the art will allow and that the specification be read likewise. It will therefore be appreciated by those skilled in the art that yet other modifications could be made to the provided invention without deviating from its spirit and scope as so claimed.

What is claimed is:

1. An electronic circuit prototyping system, comprising:
a) a personal computer having at least one expansion slot;
b) a multi-purpose data acquisition card installed in said expansion slot;
c) software associated with said data acquisition card residing in memory of said personal computer and being in communication with said data acquisition card, said software including a custom communication driver; and
d) an interface board coupled to said data acquisition card for connecting to a circuit to be tested, said interface board including i) a communication module for communicating with said data acquisition card and said associated software via said custom communication driver,
ii) a function generator interface and variable DC voltage module coupled to said communication module,
iii) a function generator module coupled to said function generator interface and variable DC voltage module,
iv) an analog I/O module coupled to said communication module and to said function generator interface and variable DC voltage module,
v) a current amplifier and frequency calibration module coupled to said communication module, to said function generator module, and to said analog I/O module, and
vi) a first edge connector for receiving one of a prototyping board and a protection board, said first edge connector being coupled to said communication module, to said function generator interface and variable DC voltage module, to said function generator module, to said analog I/O module, and to said current amplifier and frequency calibration module.

2. The system according to claim 1, wherein:
said communications module supports 8-bit write, 7-bit addressing, 1-bit parity checking, and 8-bit read.

3. The system according to claim 2, wherein:
said communications module has a data transfer rate of approximately 2400 bps.

4. The system according to claim 3, wherein:
said function generator module utilizes inexpensive digital to analog converters and analog switching gates to control a low cost analog function generator chip.

5. The system according to claim 4, wherein:
said digital to analog converters and analog switching gates are latched, so that said function generator can hold its state indefinitely.

6. The system according to claim 5, wherein:
said function generator can generate sine, triangle and square waveforms from approximately 0.1 Hz to 250 kHz.

7. The system according to claim 6, wherein:
waveform choice, coarse frequency, fine frequency, amplitude, and direct current (DC) voltage offset are all programmable.

8. The system according to claim 7, wherein:
said function generator has amplitude modulation (AM) and frequency modulation (FM) inputs coupled to said first edge connector and to said analog I/O module.

9. The system according to claim 8, wherein:
waveform output is fed back into said data acquisition card via analog gates.

10. The system according to claim 9, wherein:
said analog I/O module includes analog gates and simple linear circuits for routing analog inputs and analog outputs of said data acquisition card to emulate a full-featured digital multimeter.

11. The system according to claim 10, wherein:
said analog I/O module functions as both a 2-terminal and 3-terminal I–V curve tracer capable of characterizing diodes and transistors.

12. The system according to claim 11, wherein:
said interface board further includes
vii) a manual control module and front panel coupled to said communication module, to said function generator interface and variable DC module, to said function generator module, to said analog I/O module, and to said current amplifier and frequency calibration module.

13. The system according to claim 12, wherein:

said function generator can be controlled from said personal computer or from said manual control module and front panel.

14. The system according to claim 13, wherein:

said interface board further includes viii) an address and status module coupled to said communication module, to said function generator interface and variable DC module, to said analog I/O module, to said current amplifier and frequency calibration module and to said first edge connector.

15. The system according to claim 14, wherein:

said interface board further includes ix) a protection board installed in said first edge connector, said protection board having a second edge connector for receiving a prototyping board.

16. The system according to claim 15, wherein:

said protection board includes at least one fuse, at least one resistor network, and at least one diode network.

* * * * *